(12) United States Patent
Wacker et al.

(10) Patent No.: US 7,623,903 B2
(45) Date of Patent: Nov. 24, 2009

(54) DOUBLE CONTRAST TECHNIQUE FOR MRI-GUIDED VASCULAR INTERVENTIONS

(76) Inventors: Frank K. Wacker, Am Seedamm 8, 72074 Tuebingen (DE); Jeffrey L. Duerk, 519 Rockwood Ct., Avon Lake, OH (US) 44012; Jonathan S. Lewin, 24604 Letchworth Rd., Beachwood, OH (US) 44122; Robbert M. Maes, Houtlaan 113, 6525 ZC Nijmegen (NL)

( * ) Notice: Subject to any disclaimer, the term of this patent is extended or adjusted under 35 U.S.C. 154(b) by 1014 days.

(21) Appl. No.: 10/441,235

(22) Filed: May 19, 2003

(65) Prior Publication Data

US 2004/0039278 A1 Feb. 26, 2004

Related U.S. Application Data

(60) Provisional application No. 60/381,181, filed on May 17, 2002.

(51) Int. Cl.
*A61B 5/05* (2006.01)
(52) U.S. Cl. .................. 600/424; 600/407; 600/410; 600/420; 324/307; 324/309
(58) Field of Classification Search .............. 600/407, 600/410, 419, 431, 420–425, 413; 324/307, 324/309
See application file for complete search history.

(56) References Cited

U.S. PATENT DOCUMENTS

| | | | | |
|---|---|---|---|---|
| 5,042,486 A | * | 8/1991 | Pfeiler et al. ............... | 600/424 |
| 6,015,545 A | * | 1/2000 | Thomsen ................... | 424/9.36 |
| 6,167,297 A | * | 12/2000 | Benaron ..................... | 600/431 |
| 6,219,572 B1 | * | 4/2001 | Young ........................ | 600/431 |
| 6,246,901 B1 | * | 6/2001 | Benaron ..................... | 600/431 |
| 6,304,769 B1 | * | 10/2001 | Arenson et al. ............ | 600/424 |
| 6,377,835 B1 | * | 4/2002 | Schoenberg et al. ....... | 600/419 |
| 6,442,415 B1 | * | 8/2002 | Bis et al. ..................... | 600/420 |
| 6,463,317 B1 | * | 10/2002 | Kucharczyk et al. ....... | 600/411 |
| 6,675,037 B1 | * | 1/2004 | Tsekos ....................... | 600/417 |
| 6,748,259 B1 | * | 6/2004 | Benaron et al. ............ | 600/476 |
| 6,860,867 B2 | * | 3/2005 | Seward et al. .............. | 604/22 |
| 2002/0068866 A1 | * | 6/2002 | Zikorus et al. ............. | 600/424 |
| 2002/1006886 | * | 6/2002 | Zikorus et al. ............. | 600/424 |

(Continued)

FOREIGN PATENT DOCUMENTS

WO  WO 0072032 A1 * 11/2000

OTHER PUBLICATIONS

Maes et al., "The use of carbon dioxide in magnetic rsonance angiography: a new type of black blood imaging." J. Magn. Reson. Imaging (2000), 12:595-598.

(Continued)

*Primary Examiner*—Long V Le
*Assistant Examiner*—Sanjay Cattungal
(74) *Attorney, Agent, or Firm*—Kraguljac + Kalnay, LLC

(57) ABSTRACT

A method to detect the location of a catheter relative to a targeted location in a blood vessel is provided. One example method includes acquiring and displaying magnetic resonance (MR) images while a first MR contrast agent is present and while the operation of that first MR contrast agent is counter-acted by a second MR contrast agent. Both MR contrast agents may be introduced into a blood vessel by the catheter whose position is to be detected.

14 Claims, 3 Drawing Sheets

U.S. PATENT DOCUMENTS

2003/0055400 A1* 3/2003 Seward et al. ............... 604/522
2003/0236458 A1* 12/2003 Hochman ................... 600/431
2004/0092813 A1* 5/2004 Takizawa et al. ............ 600/423

OTHER PUBLICATIONS

Wacker et al., "MR Imaging-Guided Vascular Procedures Using Carbon Dioxide as a Contrast Agent." AJR Am J Roentgenol 181 (2003), pp. 485-489.

Maes et al., "A novel double-contrast technique to facilitate MRI-guided vascular interventions: combined use of blood-pool agent . . . " Eur. Radiol. (2002) F. 13.

Wacker et al., "MRA-Guided Vascular Interventions: In-vivo Evaluation of the Combined Use of Carbon Dioxide and a Blood-Pool Agent in a Swine Model" Abstract from Conference.

International Search Report dated Aug. 16, 2004.

\* cited by examiner

DOUBLE CONTRAST TECHNIQUE FOR MRI-GUIDED VASCULAR INTERVENTIONS

CROSS REFERENCE TO RELATED APPLICATIONS

This application claims the benefit of U.S. Provisional Patent Application No. 60/381,181 filed May 17, 2002, which is incorporated herein by reference.

STATEMENT OF GOVERNMENT SUPPORT

This invention was supported, at least in part, by NCI grants R33 CA88144-01 and NCI R01 CA81431. The United States Government may have certain rights in this invention.

FIELD OF THE INVENTION

This invention relates to the field of magnetic resonance imaging, more specifically to the use of two opposing contrast mechanisms or agents for magnetic resonance imaging (MRI) guided vascular intervention procedures.

BACKGROUND OF THE INVENTION

Oftentimes, during therapeutic procedures it is desirable to deliver a particular medical device or a therapeutic agent to a discrete location in the vasculature of a patient. Typically, such delivery is accomplished using a catheter which is introduced into a blood vessel of the patient and then advanced to the targeted location. Examples of such interventions include but are not limited to, angioplasty, stenting, determination of an embolization, local drug injections, including local chemotherapy, and gene therapy. Unfortunately, such procedures can be very difficult and time-consuming since the vasculature is highly branched. In addition, the extensive branching of the vasculature can lead to misdirection of the catheter.

In recent years, attempts have been made to use MRI to monitor the advancement of the catheter in the vasculature. The potential benefits of using magnetic resonance guidance for endovascular procedures have recently been advanced by a number of research groups .(Bakker C J, Hoogeveen R M, Hurtak W F, Van Vaals J J, Viergever M A, Mali W P. Radiology 1997; 202: 273-276; Omary R A, Frayne R, Unal O, Grist T M, Strother C M. J Vasc Interv Radiol 1999; 10: 1315-1321; Omary R A, Frayne R, Unal O et al. J Vasc Interv Radiol 2000; 11: 373-381; Spuentrup E, Ruebben A, Schaeffier T, Manning W J, Gunther R W, Buecker A. Circulation 2002; 105: 874-879; Wacker F K, Reither K, Branding G, Wendt M, Wolf K J. Mag. J Magn Reson Imaging 1999; 10: 841-844; Wildermuth S, Debatin J F, Leung D A et al. Radiology 1997; 202: 578-583; Strother C M, Unal O, Frayne R et al. Radiology 2000; 215: 516-519; Omary R A, Unal O, Koscielski D S et al. J Vasc Interv Radiol 2000; 11: 1079-1085.) These include the lack of ionizing radiation, the avoidance of iodinated contrast material, and the ability to measure changes in end-organ function with MR. Accurate visualization of the target vessels is essential during MR-guided procedures. However, the inflow effect of blood does not always provide sufficient contrast for clear vessel delineation, and is dependent upon the orientation of the imaging slice relative to the vessel and direction of blood flow. Thus, MRI procedures using magnetic or paramagnetic substances that enhance contrast have been developed. The use of Tl-shortening gadolinium preparations, such as Magnevist™ (Gd-DTPA, Schering A G, Berlin, Germany), provides a more flow-independent vessel visualization. However, Gd-DTPA has a very short intravascular retention time. Therefore, multiple injections are required to repeatedly obtain angiograms during an interventional procedure. This can cause marked enhancement of the background tissue, which reduces the vessel contrast and thus the overall image quality.

Because of the drawbacks of extracellular contrast agents, the use of intravascular paramagnetic contrast agents has received increased attention (Anzai Y, Prince M R, Chenevert T L et al. MR angiography with an ultrasmall superparamagnetic iron oxide blood pool agent. J Magn Reson Imaging 1997; 7: 209-214; Dong Q, Hurst D R, Weinmann H J, Chenevert T L, Londy F J, Prince M R. Magnetic resonance angiography with gadomer-17. An animal study original investigation. Invest Radiol 1998; 33: 699-708.) Intravascular contrast agents allow generation of high quality roadmaps of the vasculature, but, in contrast to extracellular contrast agents, also allow continuous visualization of the vessels for a certain amount of time, dependent mainly on the specific intravascular agent used (Bakker C J, Bos C, Weinmann H J. Passive tracking of catheters and guidewires by contrast-enhanced MR fluoroscopy. Magn Reson Med 2001; 45: 17-23; Wacker F K, Wendt M, Ebert W, Hillenbrandt C, Wolf K J, Lewin J S. Use of a blood-pool contrast agent for MR-guided vascular procedures: feasibility of ultrasmall superparamagnetic iron oxide particles. Acad Radiol 2002; 9: 1251-1254.) However, these methods have not always permitted accurate visualization of the target vessels, particularly accurate visualization of the location of the catheter and the vessels immediately downstream of or distal to the catheter. Accordingly, it is desirable to have additional MRI-based methods and systems for monitoring the location of the tip of an intravascular catheter and the progress and success of an intervention.

SUMMARY OF THE INVENTION

The following presents a simplified summary of methods, systems, and computer readable media associated with a double contrast technique for MRI-guided vascular intervention to facilitate providing a basic understanding of these items. This summary is not an extensive overview and is not intended to identify key or critical elements of the present methods, systems, and computer readable media or to delineate the scope of these items. This summary provides a conceptual introduction in a simplified form as a prelude to the more detailed description that is presented later.

Methods for confirming location of a catheter tip relative to a targeted location in a blood vessel of a subject and improving visualization of the blood vessels downstream of the catheter tip are provided. The methods comprise acquiring and displaying a first modified MR image, particularly a first contrast agent-modified MR image, of the subject's blood vessels between an insertion site for the catheter and the targeted location; acquiring and displaying a sequence of modified MR images of the blood vessels for monitoring advancement of an inserted catheter from the insertion site to an intralumimal stop site at or near the targeted location; delivering a bolus of a magnetic resonance contrast agent through the tip of the catheter and to the intraluminal stop site, wherein the magnetic contrast agent alters the first modified MR image of the subject's blood vessels; acquiring and displaying an updated second MR modified image of the blood vessels at and downstream of the tip of the catheter. The first modified MR image and the second modified MR image may be obtained, respectively, by injecting a first contrast agent into the vasculature of the subject and by introducing a second contrast agent into the blood through the catheter. Alternatively, the first modified MR image may be obtained using MR contrast mechanisms or techniques that brighten or darken the MR image of the subject's blood vessels.

In those embodiments where a first and second contrast agent are used to obtain the first modified MR image and the second modified MR image, respectively, of the subject's vasculature, the second contrast agent reverses, inverts, or alters the contrast mechanism of the first contrast agent. For example, if the first contrast agent enhances the brightness of the image of the blood, i.e., the first contrast agent enhances the T1 weighted image of the blood, the second contrast agent is selected to decrease the brightness of the signal that is emitted by the blood. Alternatively, the second contrast agent may directly affect certain properties of the first contrast agent. Preferably, the second contrast agent is introduced into the catheter after the first contrast agent has distributed throughout the blood or into the tissue that surrounds the blood in the targeted region of the vasculature. Preferably the contrast, i.e., the brightness or darkness of the blood relative to the surrounding tissue, resulting from the second contrast agent is short-lived, i.e., it lasts for less than one minute. In those cases where the method is used to repetitively monitor progression of the catheter through the vasculature of the subject, such that the second contrast agent is introduced into the blood multiple times as the catheter is advanced through the vasculature, it is preferred that the second contrast agent does not accumulate in the blood, i.e., the contrast agent is rapidly cleared or removed from the blood. In those cases, where the second contrast agent is introduced into the catheter only once to improve visualization of a target location in the vasculature of a subject, said target location being immediately downstream of the tip of the catheter, the contrast agent may be one that is or is not rapidly removed from the blood. Preferably, the first contrast agent is a blood pool agent that remains in the vasculature and does not leak through the endothelium.

Examples of combinations of opposing contrast agents or opposing MR mechanisms and contrast agents which may be used in the present method include, but are not limited to:
   a) a first contrast agent or MR contrast mechanism that enhances the brightness of the image of the blood, and a second contrast agent that diminishes the brightness of the image of the blood;
   b) a first contrast agent or MR mechanism that diminishes the brightness of the image of the blood, and a second contrast agent the enhances the brightness of the image of the blood;
   c) a first contrast agent that diminishes the brightness of the image of the vessel wall including pathologically changed tissues such as atherosclerotic plaque or extravascular tissue surrounding the targeted region of the blood vessel, and a second contrast agent that enhances the brightness of the image of the blood; and
   d) a first contrast agent that enhances the brightness of the image of the vessel wall including pathologically changed tissues such as atherosclerotic plaque or extravascular tissue surrounding the targeted region of the blood vessel, and a second contrast agent that enhances the brightness of the image of the blood.

In those cases where the first contrast agent is an intravascular or blood pool T1 contrast agent, i.e., a contrast agent that normally increases the rate of longitudinal (T1) relaxation of the blood and thereby enhances the brightness of the signal emitted by blood, a n especially preferred second contrast agent is $CO_2$. $CO_2$ (referred to hereinafter as a "proton density contrast agent") displaces blood in a defined region of the blood vessel. Replacement of the H-spins in the defined region of the blood vessel lumen by $CO_2$ results in a signal loss on MRI images and, thus, $CO_2$ is a very distinctive contrast agent. $CO_2$ is rapidly cleared from the blood making it an especially useful contrast agent for repeated confirmation of catheter position.

Also provided are MRI systems and computer readable media for implementing the present methods. In one aspect the MRI system comprises an MRI apparatus and a computer programmed to actuate delivery of a bolus of the second contrast agent into the catheter and initiate acquisition and display of the updated image of the blood vessels at and downstream of the tip of the catheter upon an indication that delivery of the second contrast agent has been or is about to be actuated. In another aspect the system comprises the MRI apparatus, the computer, the catheter and a storage device for the second contrast agent.

DETAILED DESCRIPTION OF THE INVENTION

Figure 1:
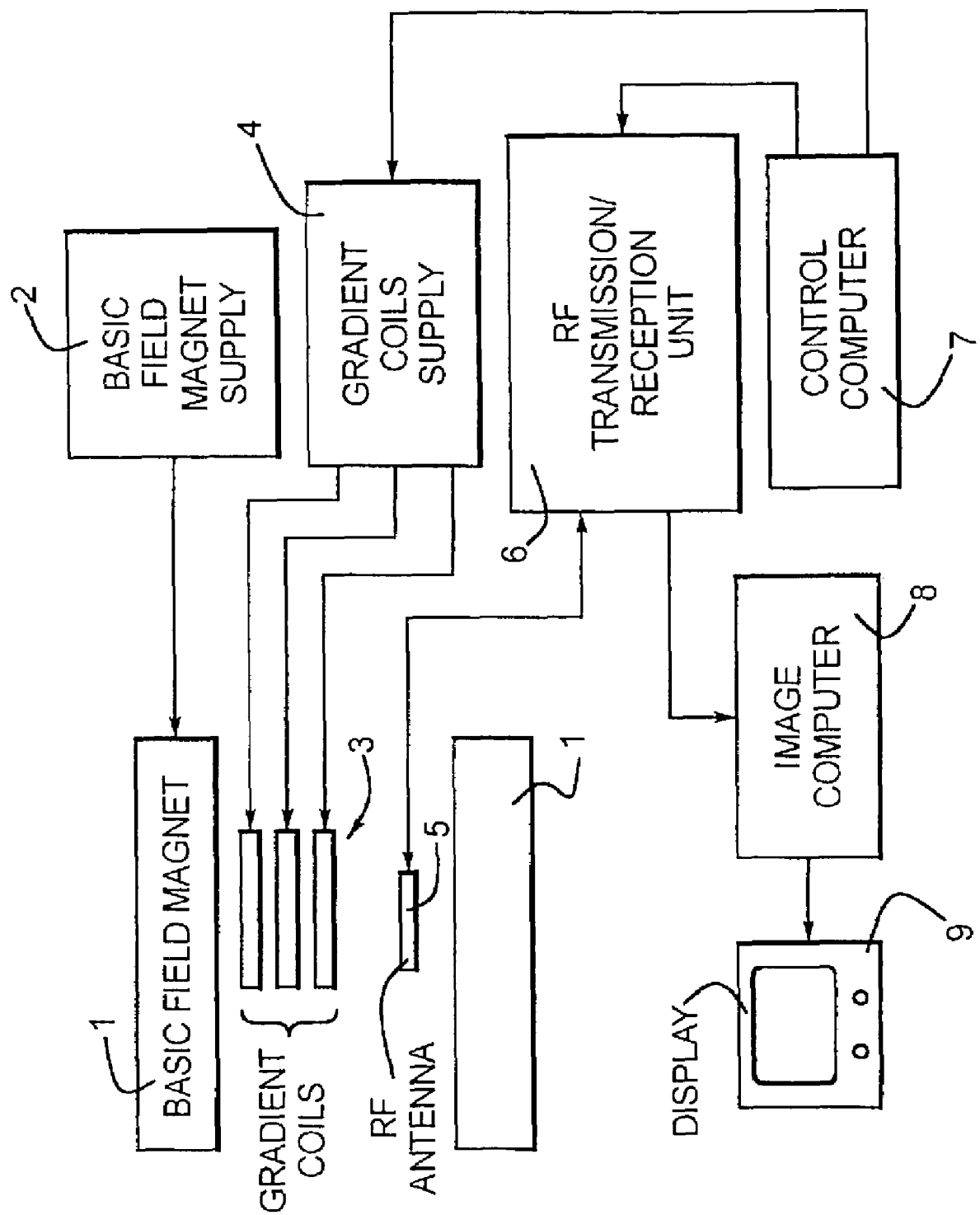
FIG. 1 illustrates an example MRI system.

Example systems, methods, and computer media, are now described with reference to the drawings, where like reference numerals are used to refer to like elements throughout. In the following description for purposes of explanation, numerous specific details are set forth in order to facilitate thoroughly understanding the methods, systems, and computer readable media. It may be evident, however, that the methods, systems, and computer readable media can be practiced without these specific details. In other instances, well-known structures and devices are shown in block diagram form in order to simplify description.

Lexicon

A. Magnetic Resonance Imaging Terms

As used herein, the term "angiogram" means a procedure in which a specific imaging technique is used to visualize blood vessels.

As used herein the term "contrast" refers to the relative difference of signal intensities in two adjacent regions of an image. Image contrast is heavily dependent on the chosen imaging technique (i.e., TE, TR, TI), and is associated with such parameters as proton density and T1 or T2 relaxation times.

As used herein the term "excitation" means delivering (inducing, transferring) energy into the "spinning" nuclei via radio-frequency pulse(s), which puts the nuclei into a higher energy state. By producing a net transverse magnetization a magnetic resonance imaging system can observe a response from the excited system.

As used herein the term "hydrogen density" refers to the concentration of hydrogen atoms in water molecules or in some groups of fat molecules within tissue. Initial MR signal amplitudes are directly related to H+density in the tissue being imaged.

As used herein the term "longitudinal relaxation time" refers to the time constant, T1, which determines the rate at which excited protons return to equilibrium within the lattice or a measure of the time taken for spinning protons to re-align with the external magnetic field. The magnetization will grow after excitation from zero to a value of about 63% of its final value in a time of T1.

As used herein the term "magnetic resonance (MR)" refers to the absorption or emission of energy by certain atomic nuclei in an external magnetic field after the application of RF excitation pulses using frequencies which satisfy the conditions of the Larmor equation.

As used herein the term "MR imaging" refers to the use of magnetic resonance principles in the production of diagnostic views of the human body where the resulting image is based upon three basic tissue parameters (proton density, T1 relaxation time, T2 relaxation time) and flow characteristics.

As used herein the term "paramagnetic substance" refers to a substance with weak magnetic properties, typically due to its unpaired electrons.

As used herein the term "proton density" refers to the concentration of mobile hydrogen atoms within a sample of tissue.

As used herein the term "proton density weighted image" refers to an image produced by controlling the selection of scan parameters to minimize the effects of T1 and T2, resulting in an image dependent primarily on the density of protons in the imaging volume.

As used herein the term "T1 weighted image" refers to an image produced by controlling the selection of scan parameters to minimize the effects of T2, resulting in an image dependent primarily on T1.

As used herein the term "T2 weighted image" refers to an image produced by controlling the selection of scan parameters to minimize the effects of T1 and proton density, resulting in an image dependent primarily on T2.

As used herein the term "pulse programmer" refers to the computer-controlled component of the MRI scanner that determines the timing of the pulse sequence parameters of the scan, such as echo time, pulse amplitude, phase and frequency.

As used herein the term "pulse sequence" refers to a preselected set of defined RF and gradient pulses, usually repeated many times during a scan, wherein the time interval between pulses and the amplitude and shape of the gradient waveforms will control NMR signal reception and affect the characteristics of the MR images.

As used herein the term "radio frequency" refers to an electromagnetic wave with a frequency that is in the same general range as that used for the transmission of radio and television signals. The RF pulses used in MR are commonly in the 1-100 megahertz range, and their principle effect upon a body is potential tissue heating caused by absorption of the applied pulses of RF energy.

As used herein the term "readout gradient" refers to magnetic field gradient applied during the period when the receiver components are on. The application of this gradient, which is active during the period when the echo is being formed, results in the frequency encoding of the object being imaged.

As used herein the term "receiver" refers to the portion of the MRI equipment that detects and amplifies the RF signals picked up by the receiver coil. Such equipment includes a preamplifier, NMR signal amplifier, and demodulator.

As used herein the term "reconstruction" refers to the mathematical process by which the displayed image is produced from the raw k-space data obtained from the receiver circuitry, typically utilizing Fourier transformation and selective filtering.

As used herein the term "region of interest (ROI)" means the area of anatomy being scanned that is of particular importance in the image.

As use herein the term "repetition time (TR)" refers to-the amount of time that exists between successive pulse sequences applied to the same slice. It is delineated by initiating the first RF pulse of the sequence then repeating the same RF pulse at a time t. Variations in the value of TR have an important effect on the control of image contrast characteristics. Short values of TR (<1000 ms) are common in spin echo images exhibiting T1 contrast, and long values of TR (>1500 ms) are common in images exhibiting T2 contrast. TR is also a major factor in total scan time.

As used herein the term "transverse relaxation time" refers to the time constant, T2, which determines the rate at which excited protons go out of phase with each other. A measure of the time taken for spinning protons to lose phase coherence among the nuclei spinning perpendicular to the main field due to interaction between spins, resulting in a reduction in the transverse magnetization. The transverse magnetization value will drop from maximum to a value of about 37% of its original value in a time of T2.

B. Computer Related Terms

As used in this application, the term "computer component" refers to a computer-related entity, either hardware, firmware, software, a combination thereof, or software in execution. For example, a computer component can be, but is not limited to being, a process running on a processor, a processor, an object, an executable, a thread of execution, a program and a computer. By way of illustration, both an application running on a server and the server can be computer components. One or more computer components can reside within a process and/or thread of execution and a computer component can be localized on one computer and/or distributed between two or more computers.

As used in this application, the term "computer communications" refers to a communication between two or more computers and can be, for example, a network transfer, a file transfer, an applet transfer, an email, a hypertext transfer protocol (HTTP) message, a datagram, an object transfer, a binary large object (BLOB) transfer, and so on. A computer communication can occur across, for example, a wireless system (e.g., IEEE 802.11), an Ethernet system (e.g., IEEE 802.3), a token ring system (e.g., IEEE 802.5), a local area network (LAN), a wide area network (WAN), a point-to-point system, a circuit switching system, a packet switching system, and so on.

"Logic", as used herein, includes but is not limited to hardware, firmware, software and/or combinations of each to perform a function(s) or an action(s). For example, based on a desired application or needs, logic may include a software controlled microprocessor, discrete logic such as an application specific integrated circuit (ASIC), or other programmed logic device. Logic may also be fully embodied as software.

("Software", as used herein, includes but is not limited to, one or more computer readable and/or executable instructions that cause a computer or other electronic device to perform functions, actions and/or behave in a desired manner. The instructions may be embodied in various forms like routines, algorithms, modules, methods, threads, and/or programs. Software may also be implemented in a variety of executable and/or loadable forms including, but not limited to, a stand-alone program, a function call (local and/or remote), a servelet, an applet, instructions stored in a memory, part of an operating system or browser, and the like. It is to be appreciated that the computer readable and/or executable instructions can be located in one computer component and/or distributed between two or more communicating, cooperating, and/or parallel processing computer components and thus can be loaded and/or executed in serial, parallel, massively parallel and other manners. It will be appreciated by one of ordinary skill in the art that the form of software may be dependent on, for example, requirements of a desired application, the environment in which it runs, and/or the desires of a designer/programmer or the like.

An "operable connection" (or a connection by which entities are "operably connected") is one in which signals and/or actual communication flow and/or logical communication flow may be sent and/or received. Usually, an operable connection includes a physical interface, an electrical interface, and/or a data interface, but it is to be noted that an operable connection may consist of differing combinations of these or other types of connections sufficient to allow operable control.

C. General Terms

To the extent that the term "includes" is employed in the detailed description or the claims, it is intended to be inclusive in a manner similar to the term "comprising" as that term is interpreted when employed as a transitional word in a claim.

To the extent that the term "or" is employed in the claims (e.g., A or B) it is intended to mean "A or B or both". When the author intends to indicate "only A or B but not both", then the author will employ the term "A or B but not both". Thus, use of the term "or" herein is the inclusive, and not the exclusive, use. See BRYAN A. GARNER, A DICTIONARY OF MODERN LEGAL USAGE 624 (2d Ed. 1995).

It will be appreciated that some or all of the processes, methods, and systems of the present invention involve electronic and/or software applications that may be dynamic and flexible processes so that they may be performed in other sequences different from those described herein. It will also be appreciated by one of ordinary skill in the art that elements embodied as software may be implemented using various programming approaches such as machine language, procedural, object oriented, and/or artificial intelligence techniques.

The processing, analyses, and/or other functions described herein may also be implemented by functionally equivalent circuits like a digital signal processor circuit, software controlled microprocessor, or an application specific integrated circuit. Components implemented as software are not limited to any particular programming language. Rather, the description herein provides the information one skilled in the art may use to fabricate circuits or to generate computer software to perform the processing of the system. It will be appreciated that some or all of the functions and/or behaviors of the present system and method may be implemented as logic as defined above.

MRI Apparatus

MRI employs a magnetic field, radio frequency energy and magnetic field gradients to make images of the body. The contrast or signal intensity differences between tissues mainly reflect the T1 (longitudinal) and T2 (transverse) relaxation values and the proton density (effectively, the free water content) of the tissues. In changing the signal intensity in a region of a patient by the use of a contrast agent, several possible approaches are available. For example, a contrast medium can be used to change either the T1, the T2 or the proton density of the tissue which contains the contrast agent.

FIG. 1 illustrates one example of a magnetic resonance apparatus. Other MRI apparatus are known to those skilled in the art and along with other well-known systems are not illustrated herein for the sake of brevity. The apparatus includes a basic field magnet 1 supplied by a basic field magnet supply 2. The system has gradient coils 3 for respectively emitting gradient magnetic fields $G_S$, $G_P$ and $G_R$, operated by a gradient coils supply 4. An RF antenna 5 is provided for generating the RF pulses, and for receiving the resulting magnetic resonance signals from an object being imaged and/or a device (e.g., catheter) inserted therein. The RF antenna 5 is operated by an RF transmission/reception unit 6. The RF antenna 5 may be employed for transmitting and receiving, or alternatively, separate coils can be employed for transmitting and receiving. The gradient coils supply 4 and the RF transmission/reception unit 6 are operated by a control computer 7 to produce radio frequency pulses that are directed to the object to be imaged. The magnetic resonance signals received from the RF antenna 5 are subject to a transformation process, like a two dimensional fast Fourier Transform (FFT), which generates pixelated image data. The transformation may be performed by an image computer 8 or other similar processing device. The image data may then be shown on a display 9. The image data may include images of both the object to be imaged and an inserted device like a catheter. Subsequent images may facilitate determining the location of the tip of the catheter.

Contrast Agents

In MR imaging, the contrast in the generated image may be enhanced by introducing into the zone being imaged an agent (a "contrast agent"), which affects the spin reequilibration characteristics of nuclei (the "imaging nuclei" which generally are protons and more especially water protons) which are responsible for the resonance signals from which the images are generated. The enhanced contrast thus obtained enables particular organs or tissues (e.g. blood, blood vessel walls, extravascular tissue, atherosclerotic plaque on blood vessel walls) to be visualized more clearly by increasing or by decreasing the brightness of the image of the particular organ or tissue relative to that of its surroundings.

Paramagnetic contrast agents contain unpaired electrons which act as small local magnets within the main magnetic field to increase the rate of longitudinal (T1) and transverse (T2) relaxation. However, at concentrations normally used in MRI, most paramagnetic contrast agents have their predominant effect on T1 relaxation. Most paramagnetic contrast agents are metal ions which in most cases are toxic. In order to decrease toxicity, these metal ions are generally chelated using ligands. The resultant paramagnetic metal ion complexes have decreased toxicity. Nitroxides are another class of MRI contrast agent which are also paramagnetic. These have relatively low relaxivity and are generally less effective than paramagnetic ions as MRI contrast agents.

Metal oxides, most notably iron oxides, have also been tested as MRI contrast agents. While small particles of iron oxide, e.g., under 20 nm diameter, may have paramagnetic relaxation properties, their predominant effect is through bulk susceptibility. Therefore magnetic particles have their predominant effect on T2 relaxation.

Methods for Confirming the Location of a Catheter Tip in a Blood Vessel

Methods which allow an operator to determine whether a catheter tip is at a targeted location in a blood vessel and to optimize visualization of the blood vessels downstream of the catheter tip are provided. The methods comprise acquiring and displaying a modified image of a subject's blood vessels between an insertion site for the catheter and the targeted location, hereinafter referred to collectively as the "operational vasculature". In one aspect, the modified image is the result of injection of a first contrast agent into the vasculature of the subject. Such image, referred to hereinafter as the "first post contrast image" is acquired using a first set of acquisition parameters (e.g. FOV, resolution). For convenience the insertion site is typically in the femoral artery of the subject. To further enhance visualization of the operational vasculature, an unmodified image or set of images of the operational vasculature, referred to hereinafter collectively as the "pre-contrast" image, is acquired prior to injection of the first contrast agent into the subject's vasculature. The acquisition parameters used to acquire the pre-contrast image and post-contrast image may be the same. One sequence useful for obtaining T1 weighted pre-contrast and post-contrast images is a 3D spoiled gradient echo sequence (FLASH) with short TR and TE and a flipangle of 25-30dg. The pre-contrast images are subtracted from the post-contrast images to produce a subtraction angiogram image. In one highly preferred embodiment, the acquired pre- and postcontrast image is a 3D gradient echo image of the operational vasculature and the resulting angiograms are presented as maximum intensity projections, as multiplanar reconstructions or with surface shaded display technique.

The imaging techniques used in the present methods may be any of the known techniques, but particularly useful are spin echo, fast spin echo, gradient echo, fast gradient echo, echo planar imaging and other techniques, being T1-weighted, T2-weighted, T2 *-weighted, or intermediate-weighted (e.g. "proton density") sequences. For the most part, the initial imaging techniques are selected to correspond to the contrast mechanism of the first contrast agent and to thereby provide an improved, detailed, highly resolved image of the operational vasculature.

In one embodiment, the first modified image is one in which the brightness of the blood is enhanced. Such enhancement can be achieved using contrast agents. Preferred are paramagnetic contrast agents comprising gadolinium(III), see "Gadolinium(III) Chelates as MRI Contrast Agents: Structure, Dynamics, and Applications" by P. Caravan et al. Chem. Rev. 99, 2293-2352 (1999). Other contrast agents that may be used include Eovist™ (Schering A G) and the contrast agents disclosed in U.S. Pat. Nos. 5,798,092 and 5,695,739; and MultiHance™ (Bracco SpA) and the contrast agents disclosed in U.S. Pat. No. 5,733,528. Particularly preferred are "blood pool" MRI contrast agents, see "Blood pool Contrast Agents for Cardiovascular MR Imaging" by L. J. M. Kroft et al. JMRI 10, 395-403 (1999), and "The Future of Contrast-Enhanced Magnetic Resonance Angiography: Are Blood Pool Agents Needed?" by A. Muhier Invest. Radiol. 33, 709-714 (1998). Examples of blood pool contrast agents include MP-2269 (Mallinckrodt, Inc.) and the contrast agents disclosed in U.S. Pat. No. 5,888,576; MS-325 (EPIX Medical, Inc.) and the contrast agents disclosed in PCT publication WO 96/23526; P760 (Geurbet); Gadomer-17™ (Schering A G) and the contrast agents disclosed in U.S. Pat. Nos. 5,876, 698, 5,820,849, 5,681,543, 5,650,136, and 5,364,614; Clariscan™ (Nycomed Amersham) and the contrast agents disclosed in PCT publications WO 96/09840 and WO 9725073; and B22956/1 (Bracco SpA) and the contrast agents disclosed in PCT publications WO 00/30688, WO 98/05625, WO 98/05626, WO 95/32741, WO 98/38738, WO 95/32741, and U.S. Pat. No. 5,649,537. Other examples of such blood pool agents, include but are not limited to, Resovist™ or SHU 555 A and C (Schering). Preferably, the dosages and imaging sequences parameters which are used with such contrast agents are selected to produce a T1 weighted image of the blood. Alternatively, a bright blood imaging technique is used. Bright blood imaging techniques use mainly the inflow of "fresh" protons into the scan volume. Such techniques are described in the following references. Doyle M, Matsuda T, Pohost G M. A new acquisition mode for 2D inflow refreshment angiography. Magn Reson Med 1991 Mar.; 18 (1):51-62, Edelman R R, Chien D, Atkinson D J, Sandstrom J. Fast time-of-flight MR angiography with improved background suppression. Radiology 1991 June; 179(3):867-70.

In another embodiment, the first modified image is one in which the brightness of the image of the blood has been diminished. In one aspect, MR techniques, (e.g. dark blood techniques) rather than contrast agents are used to obtain the first modified MR image. Such techniques may use double or triple inversion recovery pulses as described in Simonetti O P, Finn J P, White R D, et al. Black blood T2-weighted inversion-recovery MR imaging of the heart. Radiology 1996; 199: 49-57, Edelman R R, Chien D, Kim D. Fast selective black blood MR imaging. Radiology 1991; 181:655-660. Alternatively, such techniques may be a spatial presaturation technique as described in Nayak K S, Rivas P A, Pauly J M, Scott G C, Kerr A B, Hu B S, Nishimura D G. Real-time black-blood MRI using spatial presaturation. JMRI 2001; 13:807-812.

In another embodiment, a first contrast agent is introduced into the subject to enhance the brightness of the image of the extravascular tissue surrounding the targeted region of the blood vessel, blood vessel walls, atherosclerotic plaque as a part of the vessel walls, or plaque components. Examples of such contrast agents include, but are not limited to Gadophrin™ (Schering). Preferably, the dosages and imaging sequences parameters which are used with such contrast agents are selected to produce a T1 weighted image of the blood vessel walls, atherosclerotic plaque, or extravascular tissue.

In another embodiment, the first contrast agent is selected to diminish the brightness of the image of the extravascular tissue surrounding the targeted region of the blood vessel, blood vessel wall, atherosclerotic plaque on the vessel wall, or particular components of the plaque. Examples of such contrast agents include, but are not limited to iron oxides. Techniques which employ such contrast agents to diminish the brightness of atherosclerotic plaque are described in Schmitz S A, Taupitz M, Wagner S, Coupland S E, Gust R, Nikolova A, Wolf K J. Iron-oxide-enhanced magnetic resonance imaging of atherosclerotic plaques: postmortem analysis of accuracy, inter-observer agreement, and pitfalls. Invest Radiol. 2002 July; 37(7):405-11; Schmitz S A, Coupland S E, Gust R, Winterhalter S, Wagner S. Kresse M, Semmler W, Wolf K J. Superparamagnetic iron oxide-enhanced MRI of atherosclerotic plaques in Watanabe hereditable hyperlipidemic rabbits. Invest Radiol. 2000 August; 35(8):460-71; Ruehm S G, Corot C, Vogt P, Kolb S. Debatin J F. Related Articles, Links Magnetic resonance imaging of atherosclerotic plaque with ultrasmall superparamagnetic particles of iron oxide in hyperlipidemic rabbits. Circulation. 2001 Jan. 23; 103(3):415-22. In these last two embodiments high resolution MR images are preferred for better depiction of the vessel wall, the atherosclerotic plaque, and the perivascular tissue. This can be done using external coils if the vessels are close to the surface. For vessels deep in the body (aorta, coronary artery, and so on), specialized receiver coils such as an esophageal or an intravascular coil can be used during an intervention. An example would for such an coil would be the Interceptor antenna from Surgivision. The intravascular coils can be inserted though the femoral puncture site.

In those instances where the method employs both a first and a second contrast agent, a bolus of the first contrast agent is injected into a blood vessel of the subject, if the selected first contrast agent is bolus-injectable. Otherwise a slow IV infusion is used. To obtain a reliable and reproducible bolus and good timing with respect to release and acquisition of the image, it is desirable to use a programmable injector, particularly in instances where the first modified MR image is a first pass bolus MR angiogram. Following injection of the first contrast agent, an image of the vasculature, between the proposed insertion site of the catheter and the targeted location in the subject's blood vessel (referred to hereinafter as the "operational vasculature") is acquired. Preferably the whole vascular system of the patient is mapped to get an good anatomical overview and displayed on the operator screen outside the magnet room as well as on an in-the-magnet-room-monitor. Preferably, the technique used to obtain the displayed image is a 3D acquisition technique. Such image or series of images provides a roadmap which allows the operator to guide a catheter from the insertion site to an intraluminal stop site at or near the targeted location. Using such image to visualize movement of the catheter, the operator inserts the catheter into the insertion site and guides it to the intraluminal stop site. Although any type of catheter may be used, catheters that have been modified to be visible on MR images are preferred. Non-limiting examples of such catheters are a magnetite containing catheter, which is commercially available from Somatex, Berlin, Germany, and a dysprosium marker containing catheter available from Cordis, The Netherlands.

During advancement of the tip of the catheter from the insertion site into the region of interest, a sequence or series of images of the operational vasculature is acquired and displayed on the in-room monitor as well as on the main scanner console. Optionally, one or more imaging parameters, particularly field of view, is adjusted during this procedure in order to obtain a better image of the vasculature near the tip of the catheter. Such adjustments, can be made manually. Alternatively, such adjustments can be made automatically using the procedures described in the co-pending application Ser. No. 10/437,661 entitled "System and Method for Adjusting Image Parameters Based on Device Tracking," which was filed on May 14, 2003 and claims priority to U.S. Provisional Application No. 60/381,204 filed May 17, 2002.

When the catheter tip reaches the intraluminal stop site, delivery of a contrast agent, particularly a second contrast agent, through the catheter and to the intraluminal stop site is actuated. The second contrast agent reverses, inverts, or alters the mechanism of the first contrast agent and, thus, at the moment of or shortly after its release produces an altered image of the blood vessels at and immediately distal to the tip of the catheter. Thus, if the first contrast agent enhances the brightness of the image of the blood, the second contrast agent is selected to diminish the brightness of the image of the blood. In those instances where the second contrast agent is to be introduced into the blood multiple times as the catheter is advanced through the vasculature of the subject, it is preferred that the second contrast agent be rapidly cleared or removed from the blood. Preferably, an updated, close-up image using a higher in-plane resolution of the blood vessels is acquired and displayed before delivery of the second contrast agent into the catheter is actuated. Actuation of delivery of the second contrast agent and acquisition and display of the updated enlarged image of the blood vessels at or near the intraluminal stop site can be achieved by separately manipulating the contrast agent injector and MRI scanner. Alternatively, a computer implemented program can be used to achieve a coordinated actuation of the injector for the second contrast agent and adjustments to the imaging parameters of the MRI scanner. Both of these procedures (i.e., actuation of the injector and adjustments to the imaging parameters of the MRI scanner) can be achieved by manually activating the computer implemented program. Alternatively, the system may be set up such that the computer implemented program is activated automatically when the catheter reaches the intraluminal stop site using the procedures described in the co-pending application Ser. No. 10/437,661 entitled "System and Method for Adjusting Image Parameters Based on Device Tracking," which was filed on May 14, 2003 and claims priority to U.S. Provisional Application No. 60/381,204 filed May 17, 2002.

$CO_2$ is a particularly good second contrast agent for use in the present method when the first contrast agent is a blood pool agent that enhances the brightness of the image of the blood. Since $CO_2$ is a normal blood component, the human organism is equipped to completely clear large quantities of this agent during the first pass through the lungs (See, Maes R M, Matheijssen N A, Pattynama P M, Krestin G P. J Magn Reson Imaging 2000; 12: 595-598; Hawkins I F, Caridi J G. Eur Radiol 1998; 8: 391-402; Eschelman D J, Sullivan K L, Bonn J, Gardiner G A J. AJR Am J Roentgenol 1998; 171: 1265-1270; Kerns S R, Hawkins I F J. AJR Am J Roentgenol 1995; 164: 735-741), thereby reducing any residual changes in the image that result from accumulation of this agent in the blood. In addition, $CO_2$ is inexpensive, available in every hospital, and demonstrates a favorable safety profile without known allergic or nephrotoxic side effects (See, Hawkins I F, Caridi J G. Eur Radiol 1998; 8: 391-402; Kerns S R, Hawkins I F J. AJR Am J Roentgenol 1995; 164: 735-741; Kessel D O, Robertson I, Patel J et al. Cardiovasc Intervent Radiol 2002; 25: 476-483). Moreover, $CO_2$ replaces the protons in the blood and thus provides improved visualization of the blood vessels at or distal to the tip of the catheter without requiring a change in the TE, TR, or flip angle of the MRI apparatus. Because of its neurotoxicity (See Wilson A J, Boxer M M. Invest Radiol 2002; 37: 542-551), $CO_2$ is not suitable for use in cerebral angiography, and preferably is used only below the diaphragm. Other examples of contrast agents that diminish the brightness of the image of the blood are iron oxide compounds. Since iron is naturally utilized and found in the body, iron oxides also have a good safety profile.

If the method involves a procedure or a first contrast agent that diminishes the brightness of the image of the blood or the brightness of the extravascular tissue surrounding the blood vessels at and near the intraluminal stop site, the blood vessel walls, or atherosclerotic plaque, the second contrast agent is selected to enhance the brightness of the image of the blood. Gadolinium compounds are non-limiting examples of contrast agents that enhance the brightness of the image of the blood. Gadolinium DPTA is a compound that is rapidly cleared from the blood through the kidney.

Preferably, the second contrast agent is introduced into the catheter from a storage device by means of an injector. Although not necessary, it is preferred that the injector be a programmable injector to allow precise delivery, dense bolus, and reproducible injection of the second contrast agent. Preferably, the programmable injector is in operable communication with the MRI scanner to allow procurement of an updated image of the blood vessels at and immediately downstream of the tip of the catheter before during and shortly after introduction of the second contrast agent into the blood vessel through the catheter. If the second contrast agent is $CO_2$, it is highly preferred that the injector be a dedicated, programmable injector for avoiding introduction of air into the catheter. Injection of $CO_2$ can also be achieved with manual injection using a closed bag system.

An updated image, preferably an updated close-up image of the blood vessels near the tip of, particularly immediately downstream or distal to, the catheter is acquired and displayed immediately after delivery, preferably during and after delivery, and more preferably, immediately before, during and after delivery of the second contrast agent.

Advantageously, the present methods allow for the rapid generation of clinically useful MRA images which appear to have a high spatial resolution and detailed anatomical information while also illustrating the position of the catheter tip.

Systems

Systems useful to practice the present methods are provided. In one aspect, the system comprises an MRI scanner and a computer component for actuating release of the second contrast agent from its storage site are provided. Preferably, the computer component system is programmed to actuate release of the second contrast agent from its storage site while contemporaneously adjusting the imaging parameters of the MRI scanner to obtain an updated image, preferably an updated close-up image of the vasculature at and near the tip of the catheter. In a further embodiment, the system comprises an MRI scanner, a computer component for actuating release of the second contrast agent from its storage site, a computer component for adjusting the imaging parameters (e.g. FOV or resolution) of the MRI scanner upon indication that the second contrast has been or is about to released from its storage site, and a catheter for receiving the second contrast agent from the storage site. Also provided are computer readable media storing computer executable instructions operable to perform computer executable aspects of the present methods.

EXAMPLES

The invention may be better understood by reference to the following examples which serve to illustrate but not to limit the present invention.

Example 1

A First Contrast Agent that Enhances the Brightness of the Image of the Blood and a Second Contrast Agent that Diminishes the Brightness of the Image of the Blood Studies were conducted on two pigs weighing 18-26 kg. The experimental protocol was approved by our institutional Animal Care and Use Committee. The animals were anesthetized using 6 to 10 mg/kg tiletamine HCl and zolazepam HCl (Telazol®, Fort Dodge Animal Health, Iowa, USA) intramuscularly. For maintenance, ketamine and xylazine were infused and 1 mg/kg Telazol® was added IM every 45-60 min. The animals were positioned in the MR scanner (1.5 T Magnetom Sonata, Siemens Medical Solutions, Erlangen, Germany) in a supine position. After acquisition of a localizer, 3D MR angiograms were acquired before and after an IV bolus injection of Gadomer (a synthetic dendrimeric paramagnetic complex, 50 µmol per kg bodyweight, supplied by Schering A G, Berlin, Germany).

Coronal 2D true FISP images (TR, TE: 3.03, 1.52 ms, 5-10 mm slice-thickness, flip angle 40°, 3 images/s) displayed in the magnet room, were used to insert an MRI-visible straight catheter with multiple side holes into the abdominal aorta. This catheter was equipped with Dysprosium markers (5 F diameter, Cordis Corporation, Netherlands), which are visualized by means of their susceptibility artifacts. Subsequently, the renal artery was catheterized under MRI guidance using a fully MR-visible prototype catheter (5-French diameter, C-1 configuration, Somatex, Berlin, Germany) constructed with ferrite admixture that was also designed for susceptibility artifact-based visualization. Neither the mechanical nor the biological properties of the catheters used in this study differs from those of conventional angiographic devices.

With the catheter in the aorta, ten separate 40-ml $CO_2$ boluses were manually injected in each animal, each bolus injection requiring one second. The $CO_2$ was drawn from a closed bag system. The time period between each injection was at least one minute. After the C-1 catheter was introduced into the renal artery, three selective $CO_2$ injections (10-15 ml) were performed at that site.

The effect of $CO_2$ in the aorta was quantified by measuring the time-varying signal-to-noise ratios (SNR) before, during, and after $CO_2$ injections. A rectangular region of interest (ROI) was placed within the center of the aortic lumen. The signal to noise ratio (SNR) at each time point was calculated using the following formula: $SNR=SI/SD_{noise}$, where $SD_{noise}$ is the noise standard deviation obtained from an ROI placed at the image background. After normalizing the data, mean SNR values were calculated before, during and after $CO_2$ injection. A repeated measures ANOVA with planned comparisons between normalized mean SNR values before $CO_2$ injection vs. during $CO_2$ and post $CO_2$, was performed.

In the peripheral vessels of the kidney, the visibility of the arteries was subjectively graded on a three-point scale by two independent readers (1: no effect, 2: partial replacement of bright blood signal, 3: complete replacement of bright blood signal).

Results

Figure 3:
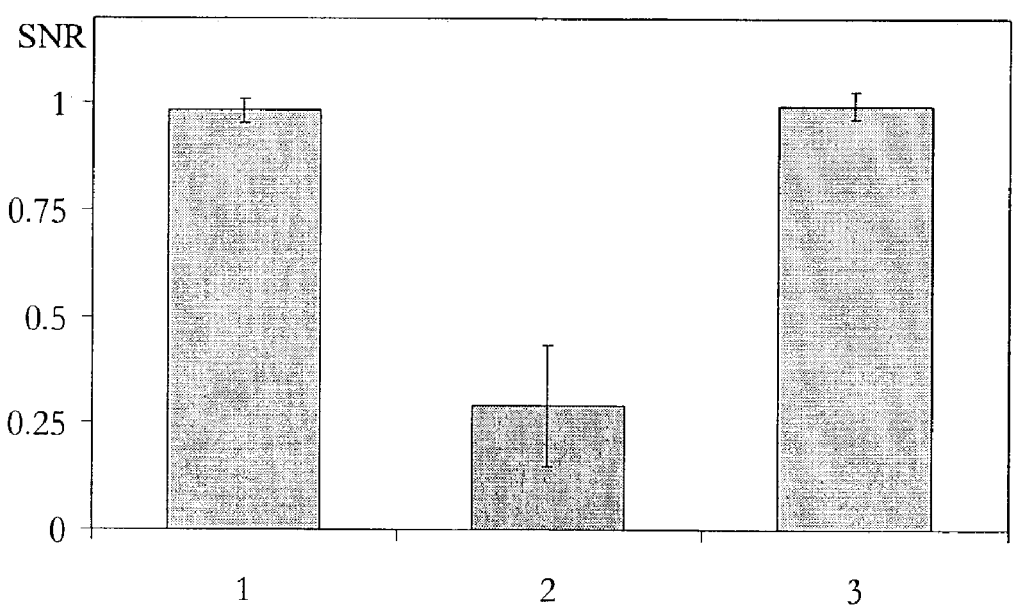
FIG. 3 is a bar graph showing mean SNR values before (1), during (2) and after (3) $CO_2$ injections (n=20) in the porcine aorta. During $CO_2$ passage, SNR is significantly reduced ($p<0.0005$) compared to the SNR before injection.

The Gadomer enhanced first-pass 3D MRA allowed visualization of the vascular anatomy of both animals. Based on these roadmap images, the image plane for catheter positioning and $CO_2$ injection could easily be planned. During the bolus injection of $CO_2$ into the suprarenal aorta, the Gadomer enhanced aortic blood was replaced for 2-5 seconds, resulting in an immediate decrease of the signal intensity in the aortic lumen. FIG. 1 shows a representative vascular signal versus time curve of a single injection. Repeated bolus injections demonstrated excellent reproducibility of the sharply delineated signal drop. The SNR before $CO_2$ injections averaged for all animals was significantly higher (p<0.0005) than the mean SNR measured during $CO_2$ injections, whereas there was no significant difference between the mean values before and after $CO_2$ injection (FIG. 3).

Figure 4A:
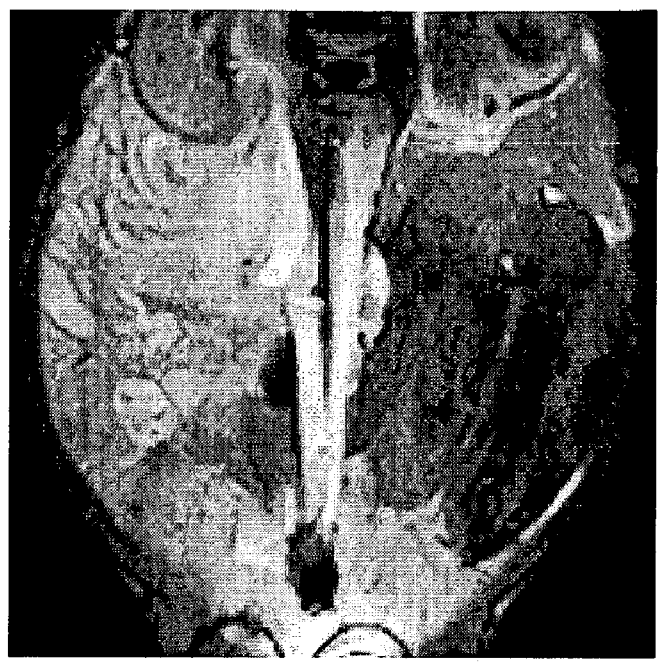
FIGS. 4a-4b shows two selected images from a coronal oblique 2D-true-FISP-image series (TR/TE: 3.03/1.52 ms, flip angle 40°, 3 images/s, 256×256 matrix, 5 mm slice thickness) of the abdominal aorta, acquired continuously before (a) and during (b) $CO_2$ injection through a catheter located in the suprarenal aorta. Both the renal (arrow) and the splenic (arrowhead) arteries can be better delineated during the $CO_2$ injection.

Using the near real-time sequence, the $CO_2$ bolus could easily be tracked in the aorta and in the renal and splenic arteries (FIG. 4). Selective injections into the renal artery facilitated confirmation of the intraluminal catheter tip location and assessment of the blood flow distal to the catheter. Subjective visual assessment showed a complete replacement (grade 3) of the intravascular signal in all experiments, even in peripheral segments of the renal artery. No susceptibility artifacts were noted during any injection. No adverse cardiovascular sequelae were noted in either anesthetized pig during any studies.

Example 2

An MR Contrast Mechanism that Enhances the Brightness of the Image of the Blood and a Contrast Agent that Diminishes the Brightness of the Image of the Blood Animal experiments were conducted on three pigs weighing 20-28 kg. The experimental protocol was approved by our institutional animal care and use committee. The animals were anesthetized with an intramuscular injection of 6 to 10 mg/kg tiletamine HCL and zolazepam HCL (Telazol, Fort Dodge Animal Health, Fort Dodge, Iowa). For maintenance, ketamine and xylazine were infused and 1 mg/kg zolazepam HCL was added intramuscular every 45-60 min. The animals were positioned in the MR scanner (1.5 T Magnetom Sonata, Siemens Medical Solutions, Erlangen, Germany) in a supine position. After acquisition of a localizer, coronal two-dimensional (2D) true-FISP images (TR, TE: 3.03, 1.52 ms, 5-8 mm slice thickness, flip angle 40°, 2 images/sec.) were used to localize the aorta and the renal arteries.

The images were displayed on an in-room monitor adjacent to the magnet; the same near-real-time imaging sequence was subsequently used for the insertion of guide wires (Terumo, Tokyo, Japan and Somatex, Berlin, Germany) and MR imaging-visible catheters (Somatex, Berlin, Germany and Cordis Corporation, Roden, The Netherlands) through the introducer sheath located in the distal iliac artery into the suprarenal aorta. The intravascular devices were visualized by means of their susceptibility artifact. For catheter manipulations, we used a fully MR-visible prototype catheter (C-1 configuration, 5-French diameter, Somatex, Berlin, Germany) constructed with ferrite admixture and a straight catheter with multiple side holes (Cordis Corporation, Roden, The Netherlands) equipped with Dysprosium markers, both of which were designed for susceptibility artifact-based visualization under MR guidance. For wire manipulations, we used a steerable hydrophilic-coated guide wire (35-inch Radifocus, Terumo, Tokyo, Japan) which generates no MR imaging artifact and a prototype Ferro Tip guide wire (Somatex, Berlin, Germany), which consisted of a 35-inch tapered MR artifact-free nitinol guide wire shaft and a 2-mm ferromagnetic tip that induces a round signal void. Neither the mechanical nor the biological properties of the catheter and guide wire prototypes used in this study differs from conventional angiographic devices.

With the catheter in position, seven separate 40 ml $CO_2$ boluses per pig were manually injected; each bolus injection required one second. The $CO_2$ was drawn from a closed bag system. The time period between each injection was at least one minute. Subsequently, the catheter was introduced into the renal artery using MR imaging guidance, and three selective renal $CO_2$ injections (10-15 ml) were performed in each animal with MR images acquired throughout the $CO_2$ bolus injection.

In the aorta, the effect of $CO_2$ was quantified by measuring the time-varying signal-to-noise ratios during the $CO_2$ bolus on every image (frame rate 2 images/s). For numeric analysis, the aortic and background signal intensities (SI) were measured retrospectively using the SSFP images. A circular region of interest was placed within the center of the aortic lumen and within the background. Mean signal intensities of the regions of interest were measured at the corresponding locations on the images acquired during the injections. The area of the aortic region of interest was variable depending on the target artery and ranged from 1326.00 to 19.00 (mean 191.85) $mm^2$. The mean area of the background region of interest was 1103.15 $mm^2$ (maximum 1675.00, minimum 313.00 $mm^2$). Based on these measurements, time profiles were calculated of mean signal-to-noise ratio values for arterial regions of interest. For each injection, three epochs (baseline, $CO_2$ passage, and signal recovery) were clearly identifiable in the signal-to-noise ratio versus time plot. The durations of the epochs were variable both within and between subjects. For consistency, the number of points included from each epoch in the analysis was held constant, and corresponded to the length of shortest instance of that epoch across all trials. From each trial, the two points just prior to the beginning of the $CO_2$ passage were used for pre-injection baseline observations, the first two points of the $CO_2$ passage were included as post-injection observations, and the three points just after signal recovery (following bolus) were used for the last epoch (FIG. 1). Four instances (from all 21 boluses) of intermediate signal-to-noise ratio values occurred at the transition between the blood signal and the $CO_2$ signal. These values were interpreted as transitions between epochs rather than belonging to a particular epoch and thus were excluded from the analysis. The selected signal-to-noise ratio values within each epoch were pooled, averaged and plotted.

A repeated-measures analysis of variance with mean lumen signal-to-noise ratio as the dependent variable and epoch-type as a single three-level (baseline, $CO_2$ passage, and signal recovery) within-subjects factor was performed. The statistical significance of the effect of the independent factor was assessed using the following orthogonal planned-contrasts (baseline versus $CO_2$ passage and $CO_2$ passage versus signal recovery). Pearson product-moment correlation coefficients were also calculated between the baseline signal-to-noise ratio and the signal drop during $CO_2$ and between background noise and the mean signal-to-noise ratio of each of the three epochs. For all tests, a p-value of 0.05 or less indicated a statistically significant difference.

In the renal vessels, the effect of $CO_2$ was subjectively graded by two readers in consensus. The vascular tree was divided into three segments: renal artery, first order branches and intrarenal arteries. At each segment interpretation, the readers graded the depiction of the segment before and after $CO_2$ injection on a 3-point scale as: A-inadequate (impossible to delineate a vessel); B—intermediate (image quality is intermediate but vessel can be delineated); and C—excellent (vessel segment can be clearly identified). In addition, the effect of the $CO_2$ injection on flow assessment was evaluated using a cine loop display. For each segment the readers graded the depiction of flow during both the $CO_2$ injection and the recovery phase on a 3-point scale as: A—inadequate (impossible to delineate flow); B—intermediate (no continuous vessel delineation but dynamic changes during $CO_2$ injection and washout can be identified); and C—excellent ($CO_2$ injection/washout can be clearly identified along the vessel segment).

1 Results

Figure 2:
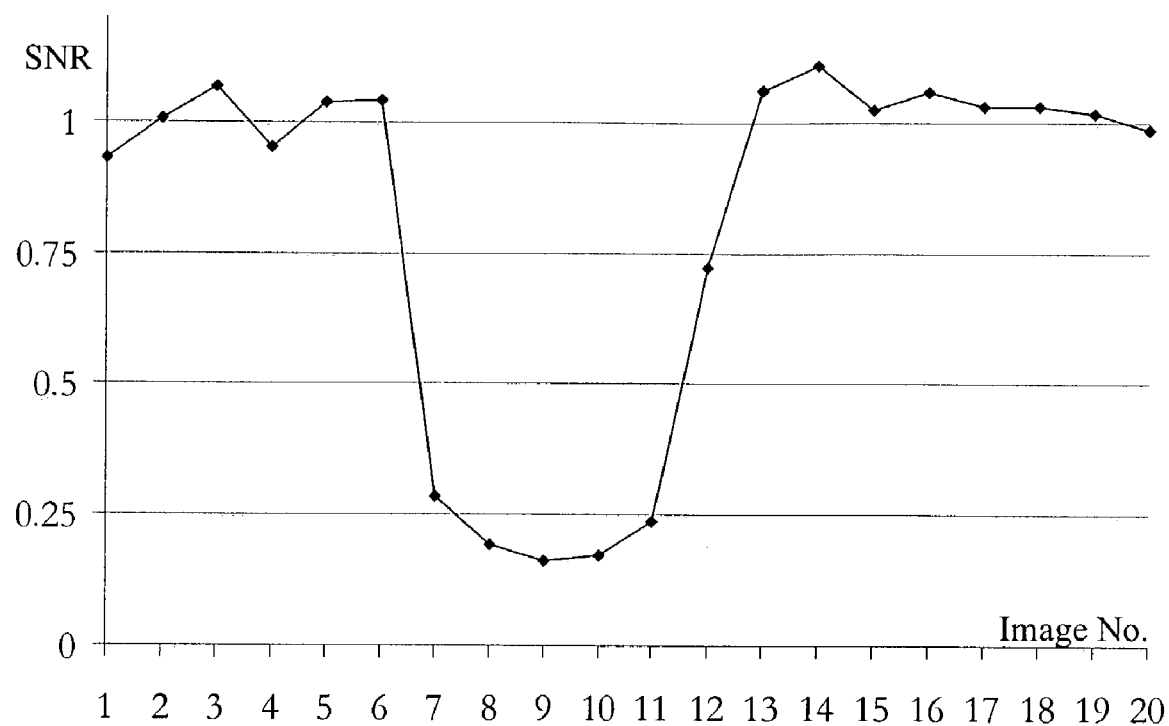
FIG. 2 is a graph showing the signal to noise ration (SNR) of a region of interest (ROI) positioned in the aortic lumen of a pig before, during and after a single $CO_2$ injection through a catheter located in the abdominal aorta.

During bolus injection of CO2 into the suprarenal aorta, the bright aortic blood was totally replaced for 1-5 seconds. The $CO_2$ formed a moving gaseous column resulting in an immediate decrease of the signal intensity in the aortic lumen immediately after starting the injection with an immediate signal increase as the gas left the vessel segment. Hence, one bolus injection allowed assessment of the flow not only during the actual contrast injection but also when the bright blood returned, thereby replacing the low-signal gas. Using the near real-time sequence, the $CO_2$ bolus could be tracked into the renal and splenic arteries. Repeated bolus injections showed the excellent reproducibility of this sharply delineated signal decrease and signal recovery (FIG. 1). The group signal-to-noise ratio mean+/−SD for each epoch were: baseline (6.35±1.43); $CO_2$ passage (2.33±0.74); and signal recovery (5.95±1.54) (FIG. 2). Signal-to-noise ratio during $CO_2$ bolus passage was statistically significantly less than either the baseline (F=274.1, p<0.0005) or recovery signal-to-noise ratio (F=167.0, p<0.0005). The magnitude drop in signal-to-noise ratio was highly correlated with the baseline signal-to-noise ratio (r=0.86, p<0.0005). This was not likely a result of the signal scaling differences between trials since there was no correlation between the background (noise) signal intensities and the raw signal levels during any of the three epochs (r<0.12, p=NS all cases). Also, the noise values were very stable across the trials ($S_{NOISE}$ mean=30.72, 95% CI 29.13-32.3). The most likely explanation is that signal from a gaseous bolus might be considered equivalent to noise signal in air outside the body. This would result in a calculated signal to noise ratio of unity. However, signal-to-noise ratio during $CO_2$ passage was statistically significantly higher than 1 (2.44±0.76, one sample t-test, t=8.47, p<0.0005).

Figure 4B:
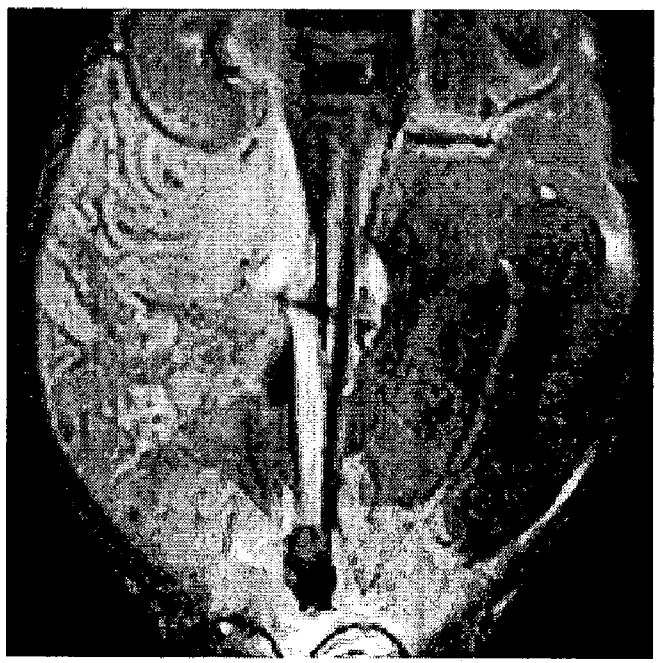

After selective catheterization of the renal artery, a drop in the signal intensity could be observed in all pigs. This was most likely caused by reduced blood flow after catheter insertion (FIG. 4B). Subsequent selective $CO_2$ injections into the renal artery facilitated its delineation and those of the first- and second-order branches. This allowed assessment of the vessel patency at all levels and improved conspicuity of the intrarenal arteries which were hardly visible with the true-FISP sequence alone (Table 1).

These results show that the intraarterial transcatheter use of $CO_2$ in combination with a SSFP sequence for real-time MR image guidance, improves vessel conspicuity and allows selective assessment of flow distal to a catheter during an intravascular MR-guided procedure.

TABLE 1

Renal artery conspicuity and flow assessment after $CO_2$ injection

|  | renal artery* | | | $2^{nd}$ order renal arteries | | | intrarenal arteries | | |
|---|---|---|---|---|---|---|---|---|---|
| Grade | A | B | C | A | B | C | A | B | 2.C |
| Conspicuity baseline | 1 | 1 | 4 | 1 | 1 | 7 | 2 | 5 | 2 |
| Conspicuity $CO_2$** | 0 | 1 | 5 | 0 | 1 | 8 | 1 | 3 | 5 |
| Flow assessment*** | 0 | 1 | 5 | 0 | 0 | 9 | 1 | 2 | 6 |

*One renal artery (three experiments) could not be evaluated because catheter obscured lumen.
**Vessel conspicuity: A: inadequate (impossible to delineate a vessel); B: intermediate (image quality is intermediate but vessel can be delineated); C: excellent (vessel segment can be clearly identified).
***Flow assessment A: inadequate (impossible to delineate flow); B: intermediate (no continuous vessel delineation but dynamic changes during $CO_2$ injection and washout can be identified); C: excellent ($CO_2$ injection/washout can be clearly identified along the vessel segment).

What is claimed is:

1. A method for determining the location of a catheter tip relative to a targeted location in a blood vessel of a subject and visualizing blood vessels at or distal to the tip of the catheter, comprising:
   controlling an apparatus to cause a first magnetic resonance (MR) contrast agent to be injected into a blood vessel through a catheter inserted into the blood vessel;
   acquiring and displaying a first post-contrast MR image of the blood vessels between an insertion site for the catheter and a targeted location for the catheter;
   monitoring movement of the catheter;
   controlling an apparatus to cause a second MR contrast agent to be injected into the blood vessel through the catheter, where the second MR contrast agent inverts the contrast mechanism of the first contrast agent;
   acquiring and displaying a second post-contrast MR image of the blood vessel between the catheter and the target location, and
   determining the location of the catheter tip relative to the targeted location in the blood vessel of the subject based, at least in part, on the first post-contrast MR image and the second post-contrast MR image.

2. The method of claim 1, including causing a bolus of the second MR contrast agent to be delivered into the blood vessel through the catheter, where the second MR contrast agent reverses, at least in part, the contrast mechanism of the first MR contrast agent.

3. The method of claim 1, including acquiring and displaying a pre-contrast MR image of the blood vessel prior to acquiring and displaying the first post-contrast MR image.

4. The method of claim 3, including acquiring an initial three-dimensional MR image of the blood vessel prior to acquiring and displaying the first post-contrast MR image.

5. The method of claim 2, where causing a first MR contrast agent to be introduced into the blood vessel includes causing a first MR contrast agent that enhances the brightness of an MR image of blood to be delivered and where causing a second MR contrast agent to be introduced into the blood vessel includes causing a second MR contrast agent that diminishes the brightness of an MR image of blood to be delivered.

6. The method of claim 5, where causing a second MR contrast agent to be introduced into the blood vessel includes causing carbon dioxide to be delivered into the blood vessel.

7. The method of claim 5, where causing a second MR contrast agent to be introduced into the blood vessel includes causing to be introduced a second contrast agent whose contrast mechanism is short-lived compared to the contrast mechanism of the first contrast agent.

8. The method of claim 2, where causing a first MR contrast agent to be introduced into the blood vessel includes causing a first contrast agent that diminishes the brightness of an MR image of blood to be introduced, and where causing a second MR contrast agent to be introduced includes causing a second contrast agent that enhances the brightness of an MR image of blood to be introduced.

9. The method of claim 2 where the first MR contrast agent diminishes the brightness of the MR image of one or more of extravascular tissue surrounding the targeted region of the blood vessel, blood vessel wall, and atherosclerotic plaque on blood vessels, and where the second contrast agent enhances the brightness of an MR image of blood.

10. The method of claim 2 where the first contrast agent increases the rate of longitudinal (T1) relaxation of the blood and the second contrast agent is $CO_2$.

11. The method of claim 1 wherein the second post-contrast MR image is a close up image of the blood vessels near the tip of the catheter.

12. A system for determining the location of a catheter tip relative to a targeted location in a blood vessel of a subject and visualizing blood vessels at or distal to the tip of the catheter, comprising:

an MRI apparatus;

a computer component programmed to acquire and display an MR image of the subject's vasculature following injection of a first contrast agent into the subject through a catheter to a blood vessel;

a computer component programmed to actuate release of a bolus of a second contrast agent the catheter to the blood vessel, where the second contrast agent inverts the contrast mechanism of the first contrast agent; and a computer component programmed to initiate acquisition and display of an updated MR image of the blood vessels at and downstream of the tip of the catheter upon an indication that release of the bolus of the second contrast agent is to be or has been actuated, where the MR image associated with the first contrast agent and the updated MR image associated with the second contrast agent are acquired with the same echo time (TE), repetition time (TR), and flip angle.

13. The system of claim 12 wherein the first contrast agent is a blood pool agent that enhances the brightness of the MR image of the subject's blood, and the second contrast agent is $CO_2$.

14. The system of claim 12 wherein the system also comprises a storage site for the second contrast agent.

* * * * *

UNITED STATES PATENT AND TRADEMARK OFFICE
CERTIFICATE OF CORRECTION

| | | |
|---|---|---|
| PATENT NO. | : 7,623,903 B2 | Page 1 of 1 |
| APPLICATION NO. | : 10/441235 | |
| DATED | : November 24, 2009 | |
| INVENTOR(S) | : Wacker et al. | |

It is certified that error appears in the above-identified patent and that said Letters Patent is hereby corrected as shown below:

In column 1, line 42, delete "groups ." and insert --groups.--.

In column 2, line 8, delete "attention" and insert --attention.--.

In column 2, line 19, delete "used" and insert --used.--.

In column 3, line 64, delete "a n" and insert --an--.

In column 4, line 21, delete "ration" and insert --ratio--.

In column 7, line 1, delete "(Software" and insert --Software--.

In column 11, line 46, delete "adjustments," and insert --adjustments--.

In Column 13, line 4, delete "before during" and insert --before, during,--.

In Column 13, line 26, delete "are provided".

In column 13, line 37, delete "to released" and insert --to be released--.

In column 19, line 7, claim 12, delete "agent the" and insert --agent through the--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,623,903 B2 Page 1 of 1
APPLICATION NO. : 10/441235
DATED : November 24, 2009
INVENTOR(S) : Wacker et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1458 days.

Signed and Sealed this

Twenty-sixth Day of October, 2010

David J. Kappos
*Director of the United States Patent and Trademark Office*